(12) United States Patent
Siciliani et al.

(10) Patent No.: US 12,183,407 B2
(45) Date of Patent: Dec. 31, 2024

(54) SETTING SWITCHING FOR SINGLE-LEVEL CELLS

(71) Applicant: Micron Technology, Inc., Boise, ID (US)

(72) Inventors: Umberto Siciliani, Rubano (IT); Tao Liu, San Jose, CA (US); Ting Luo, Santa Clara, CA (US); Dionisio Minopoli, Frattamaggiore (IT); Giuseppe D'Eliseo, Caserta (IT); Giuseppe Ferrari, Naples (IT); Walter Di Francesco, Avezzano (IT); Antonino Pollio, Vico Equense (IT); Luigi Esposito, Piano di Sorrento (IT); Anna Scalesse, Arzano (IT); Allison J. Olson, Boise, ID (US); Anna Chiara Siviero, Albignasego (IT)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 17/736,902

(22) Filed: May 4, 2022

(65) Prior Publication Data
US 2022/0406388 A1    Dec. 22, 2022

Related U.S. Application Data

(60) Provisional application No. 63/211,341, filed on Jun. 16, 2021.

(51) Int. Cl.
*G11C 16/10* (2006.01)
*G11C 16/14* (2006.01)
(Continued)

(52) U.S. Cl.
CPC ........ *G11C 16/3459* (2013.01); *G11C 16/102* (2013.01); *G11C 16/14* (2013.01); *G11C 16/26* (2013.01)

(58) Field of Classification Search
CPC ... G11C 16/3459; G11C 16/102; G11C 16/14; G11C 16/26; G11C 16/10; G11C 16/16;
(Continued)

(56) References Cited

U.S. PATENT DOCUMENTS 10,347,329 B2 *   7/2019   Jean ....................... G11C 16/10
10,943,634 B2 *   3/2021   Jung ................... G11C 11/5642
(Continued)

*Primary Examiner* — Khamdan N. Alrobaie
(74) *Attorney, Agent, or Firm* — Holland & Hart LLP

(57) ABSTRACT

Methods, systems, and devices for setting switching for single-level cells (SLCs) are described. A memory system may receive an access command from a host. The access command may correspond to an SLC block or to a multiple-level cell block. If the access command corresponds to an SLC block, the memory system may modify the access command to include one or more bits indicating a setting to use for performing the access operation corresponding to the access command. The setting may define one or more operating parameters for performing the access operation. The memory system may use bits to indicate the setting that are used to indicate a page address for multiple-level cell blocks. The memory system may issue the access command to a memory device, which may perform the access operation using the setting indicated in the one or more bits included by the memory system.

33 Claims, 9 Drawing Sheets

(51) Int. Cl.
*G11C 16/26* (2006.01)
*G11C 16/34* (2006.01)

(58) Field of Classification Search
CPC ... G11C 29/4401; G11C 16/08; G06F 3/0659; G06F 3/0644; G06F 3/0679
See application file for complete search history.

(56) References Cited

U.S. PATENT DOCUMENTS

| | | | |
|---|---|---|---|
| 2008/0175058 A1* | 7/2008 | Kang | G11C 16/26 365/185.11 |
| 2009/0296478 A1* | 12/2009 | Kim | G11C 16/0483 365/185.18 |
| 2014/0359346 A1* | 12/2014 | Chen | G06F 11/1072 714/6.11 |
| 2015/0228346 A1* | 8/2015 | Choi | G11C 16/16 365/185.29 |
| 2017/0047124 A1* | 2/2017 | Ellis | G06F 3/0637 |
| 2022/0083253 A1* | 3/2022 | Kwon | G11C 11/5671 |
| 2022/0406388 A1* | 12/2022 | Siciliani | G11C 16/102 |

* cited by examiner

SETTING SWITCHING FOR SINGLE-LEVEL CELLS

CROSS REFERENCE

The present Application for Patent claims priority to U.S. Provisional Patent Application No. 63/211,341 by Siciliani et al., entitled "SETTING SWITCHING FOR SINGLE-LEVEL CELLS", filed Jun. 16, 2021, which is assigned to the assignee hereof and is expressly incorporated by reference in its entirety herein.

FIELD OF TECHNOLOGY

The following relates generally to one or more systems for memory and more specifically to setting switching for single-level cells.

BACKGROUND

Memory devices are widely used to store information in various electronic devices such as computers, user devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
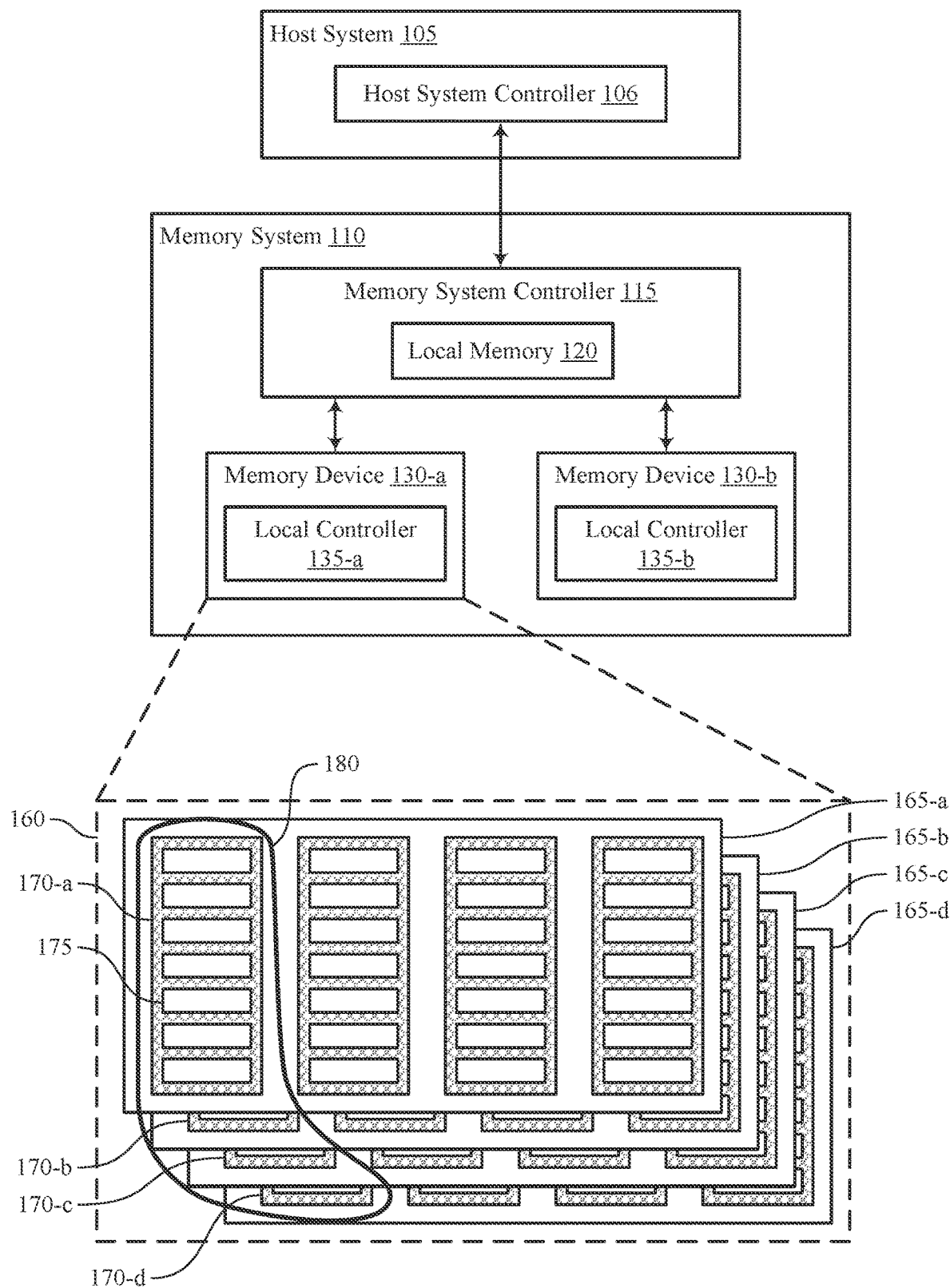
FIGS. 1 and 2 illustrate examples of systems that support setting switching for single-level cells (SLCs) in accordance with examples as disclosed herein.

In some memory systems, one set of a plurality of settings (e.g., trim parameters) may be used to perform access operations (e.g., read, write, or erase operations) on blocks of memory cells. For example, the memory system may use a first setting (e.g., set of trim parameters) to perform relatively fast (i.e., compared to other settings) access commands. In some cases, multiple blocks of memory cells in a specific partition of a memory array may use a same setting. Some memory systems may determine the setting of a block of memory cells using a block address range or according to the partition of the block of memory cells. However, in some cases, a block of memory cells from a first partition (e.g., a first range of blocks) may replace a bad block of memory cells from a second range or partition, where the first range and second range may be configured for different settings. In such cases, determining the setting of the block of memory cells using the block address range scheme may result in using a different setting (e.g., trim parameters) to read information from a block of memory cells than the setting (e.g., trim parameters) previously used to write to the block of memory cells. In some examples, such a discrepancy in the settings used for access operations may potentially result in failed access operations, an increase in system latency, or both.

To mitigate performing access operations on a block of memory cells using settings that don't match previous settings, a memory system may support dynamically indicating a setting in an access command. By using the access command to specifically indicate which setting to use, the memory system may configure a memory device to use the same setting used for a previous access operation, such that the access operations do not result in unexpected voltage threshold distributions or failed read operations. In some cases, the memory system may indicate the setting for an access command using one or more bits of the access command. For example, the address of some blocks of memory cells (e.g., single-level cell (SLC) blocks) may use relatively fewer address bits than other blocks of memory cells, such as multiple-level cell blocks (e.g., multi-level cell (MLC) blocks, tri-level cell (TLC) blocks, quad-level cell (QLC) blocks). The memory system may use one or more bits of an access command corresponding to an SLC block to indicate the setting for performing the access command on the SLC block. Thus, the memory device receiving the access command may read from or write to the SLC block using a same setting by selecting the setting indicated by the access command, rather than determining a setting from a block address (which may be misaligned due to block replacement operations). Using the same setting to read from and write to a block of memory cells may improve system performance by improving system reliability, reducing system latency, and reducing power consumption associated with performing additional access commands (e.g., in response to a failed access command).

Figure 2:
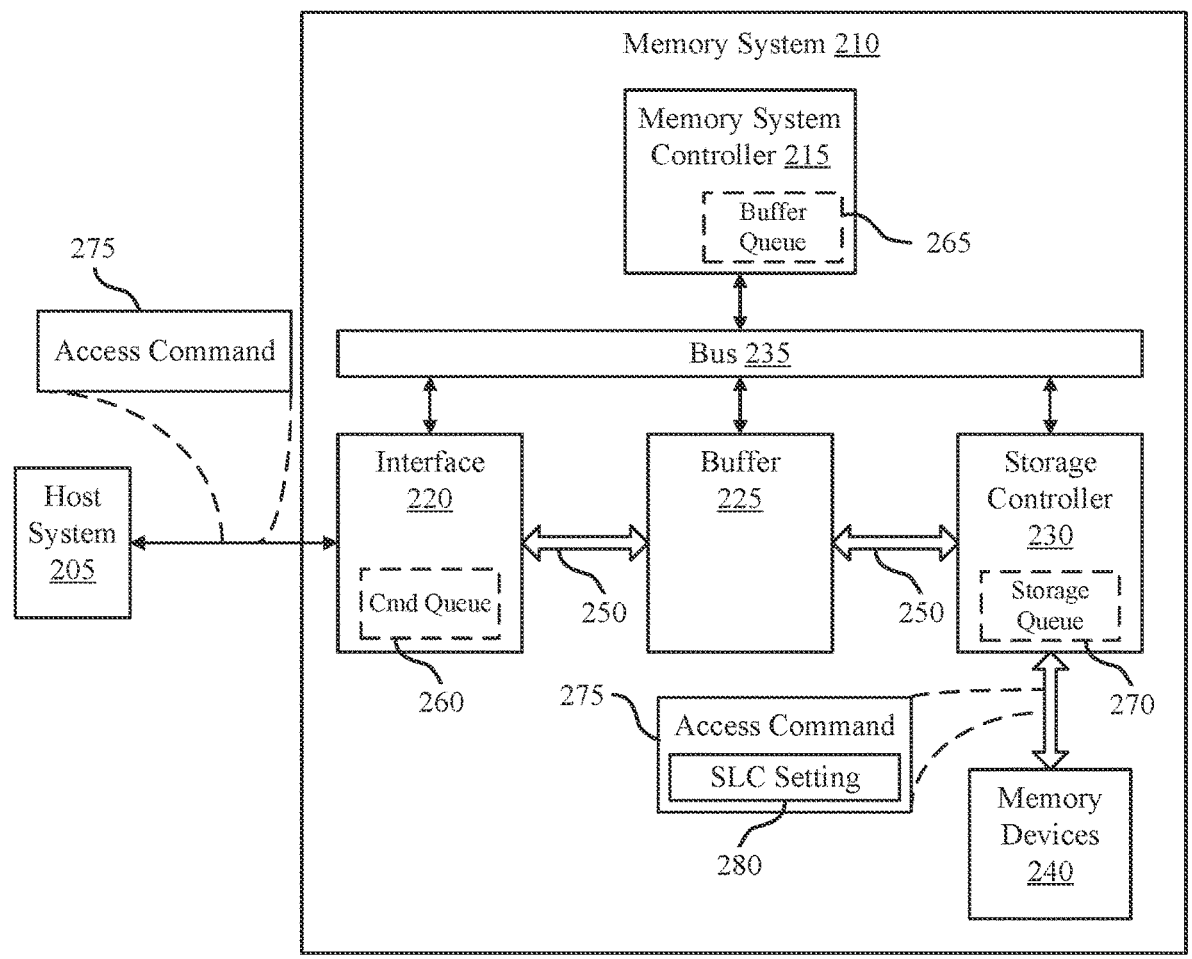

Features of the disclosure are initially described in the context of systems and devices with reference to FIGS. 1 and 2. Features of the disclosure are described in the context of process flows and memory cells with reference to FIGS. 3 through 5. These and other features of the disclosure are further illustrated by and described in the context of apparatus diagrams and flowcharts that relate to setting switching for SLCs with reference to FIGS. 6 through 9.

FIG. 1 illustrates an example of a system 100 that supports setting switching for SLCs in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations-which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as SLCs. Additionally or alternatively, a NAND memory device 130 may include memory cells configured to each store multiple bits of information, which may be generally referred to as multiple-level cells or, more specifically, referred to as MLCs if configured to each store two bits of information, as TLCs if configured to each store three bits of information, as QLCs if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support setting switching for SLCs. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is an MNAND system.

In some memory devices 130, a block 170 of memory cells configured to store one bit of data per memory cell (i.e., an SLC block) may be configured to store data using one of a set of multiple settings. In some cases, the settings may be referred to as trims, SLC trims, trim settings, or configurations, among other examples. Each setting may include an indication of one or more operating parameters for performing access operations if using the setting. For example, a setting may define a voltage distribution for voltage levels of the SLC block. That is, the setting may indicate the voltage levels corresponding to logical states of the SLC block, such as a voltage level corresponding to a logical "0," a voltage level corresponding to a logical "1," a difference in voltage levels between the two logical states, or a combination thereof.

In some cases, the set of settings may include a dynamic setting (e.g., a dynamic SLC or dynamic trim) configured for fast write performance relative to other settings. For example, the dynamic setting may be used for SLC blocks that are targeted as part of a write burst mode of the memory system 110.

The settings may also include a static setting (e.g., a static SLC or static trim) configured for high endurance relative to the dynamic setting. For example, a block 170 of memory cells may perform access commands using the static setting if a relatively high quantity of access commands (e.g., above a threshold quantity) are performed on the block 170, such that the memory cells of the block 170 may satisfy a lifetime threshold (e.g., a terabytes written (TBW) threshold) of the memory device 130.

In some cases, the settings may also include a high endurance setting (e.g., a high endurance SLC or high endurance trim) configured for high endurance relative to the static setting and the dynamic setting. For example, a block 170 of memory cells that perform access commands using the high endurance setting may be able to perform a relatively high quantity of access commands over the life of the memory cells (i.e., a higher quantity of access commands than a block of memory cells using the dynamic setting or the static setting). However, the static setting and the dynamic setting may support relatively higher reliability of data accuracy than the high endurance setting.

Additionally, the settings may include a production state awareness (PSA) setting (e.g., a PSA SLC or PSA trim) configured for writing data prior to an infrared (IR) reflow process. For example, a memory device may be subject to one or more manufacturing processes, such as soldering to a memory system or printed circuit board (PCB), after data is programmed to the cells of the memory device. In some cases, a manufacturing process may subject the memory cells to relatively harsh conditions compared to other uses, such as high temperatures (e.g., above a temperature threshold). Such conditions may potentially negatively affect the integrity of the data programmed to the memory cells prior to the manufacturing process. A block 170 of memory cells storing data written using the PSA setting may have a relatively higher reliability compared to other settings. That is, data written using the PSA setting may be configured to maintain accuracy following one or more manufacturing processes, such as IR reflow.

In some cases, the memory system 110 may configure a contiguous set of blocks 170 of memory cells in which to use one of the settings. For example, the memory system 110 may use a starting address and a stopping address to indicate a block address range for applying a specific setting. In some cases, the block address range may be set by, for example, firmware during a pre-boot sequence.

In some other systems, a memory device may perform an access command according to the setting indicated by the block address range. That is, the memory device may use an address included in the access command to determine a block address range and correspondingly which setting to use for performing the access command. Using the block address range to indicate a setting may not allow an overlap between address ranges. That is, each physical address may correspond to a single setting. However, in some cases, a multiplane operation (e.g., an access operation which accesses multiple blocks of memory cells in separate planes) may access two or more blocks which each correspond to a different block address range, and thus a different setting. In such cases, the multiplane operation may use one of the settings (e.g., the setting corresponding to the lowest accessed plane) to access each of the blocks of memory cells indicated in the multiplane operation. That is, some blocks of memory cells may be accessed using a setting different from the setting indicated by the block address range. Accessing a block of memory cells using a different setting may increase the likelihood of errors, decrease performance speed, increase power consumption, or any combination thereof.

Additionally or alternatively, in some other systems, a memory system may trigger a switch of settings using a single set media-local-bus interface (MLBi). For example, each time a memory device is to switch the setting to use for access operations, the memory system may issue a dedicated MLBi command to switch to the new setting. However, a system using the dedicated MLBi command may fail to support specific operations, such as cache program and cache read operations. For example, the firmware at a memory system may mix cache program and cache read operations across different partitions to improve performance. To support the dedicated MLBi commands, the memory system may stop issuing commands to memory devices if there is a switch between partitions due to a random read to read a table, a redundant array of independent NAND (RAIN) parity programming operation, a table update, host commands indicating different partitions, or any combination of these or other operations. The memory system may stop issuing the commands to issue a dedicated MLBi command to perform the setting switch, significantly reducing the performance of the memory system (e.g., below a performance threshold).

In contrast, the memory system 110 may include an indication of a setting in an access command, such that a memory device 130 may determine which setting to use according to the access command, rather than the block address range or a separate dedicated MLBi command. Accordingly, the memory device 130 may access an indicated a block 170 using the proper setting (e.g., SLC trim) regardless of the physical block address and the type of access (e.g., single-plane 165 versus multi-plane 165) using information provided in the access command itself.

FIG. 2 illustrates an example of a system 200 that supports setting switching for SLCs in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on (e.g., in response to) the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, if the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some cases, the host system 205 may transmit an access command 275 (e.g., a read command, a write command, or an erase command) to the memory system 210. The memory system 210 may, in response to receiving the access command 275, modify and issue the access command 275 to a memory device 240. The access command 275 received by the memory system 210 may include an indication of a memory cell address within a memory device 240. The indication may include a column address, a row address, a page address, a bank address, or any combination thereof.

The memory system 210 may modify the access command 275 received from the host system 205 using a flash translation layer (FTL) included, for example, in the memory system controller 215. The FTL may modify the access command 275 in response to determining whether the memory cell indicated in the access command 275 is part of an SLC block or a multiple-level cell block, such as an MLC block, a TLC block, a QLC block, or another block of memory cells configured to store more than one bit of data.

In some cases, in response to determining that the one or more memory cells indicated by the access command 275 are part of one or more SLC blocks, the FTL may modify the access command 275 to include an indication of a setting (e.g., one of a set of multiple configured settings, as described with reference to FIG. 1) for a block of memory cells. In some cases, the FTL may include a mapping between partitions of virtual block addresses and settings. That is, each virtual block address for a block of memory cells may be associated with a partition of a memory device and a corresponding setting, regardless of the physical address of the block of memory cells. The FTL may modify the access command 275 to include an indication of the setting (e.g., an SLC setting 280) to be used in the access operation for the block of memory cells indicated by the access command 275. The memory system 210 may issue the modified access command 275 including the indication of the SLC setting 280 to the memory device 240, such that the memory device 240 may perform the access operation indicated by the access command 275 using the indicated SLC setting 280.

For example, an access command 275 for a multiple-level cell block (i.e., a multiple-level cell access command), such as an MLC block, a TLC block, or a QLC block, may include an address that uses more bits than an address corresponding to an access command 275 for an SLC block (i.e., an SLC access command). However, in some cases, the quantity of bits allocated for indicating the address in the access command may be the same size for both an SLC access command and a multiple-level cell access command. Thus, there may be one or more bits included in the access command that may be used for address indication in a multiple-level cell access command and may be used for a different purpose in an SLC access command. In some cases, a memory system 210 may reuse such bits to indicate the SLC setting 280 in an SLC access command.

The access command 275 may be issued from the memory system 210 to the memory device 240 using a bus with a quantity of data pins (e.g., an 8-pin bus) over multiple cycles. Each cycle may include a quantity of bits equal to the quantity of data pins, where each bit may correspond to a bit field containing n indices, such as a column address (CA) bit field, a page address (PA) bit field, a bank address (BA) bit field, a logical unit address (LA) bit field, a plane setting (PS) bit field, or any combinations thereof. Each bit may be ordered within the corresponding bit field according to an index, n (e.g., the CA7 bit may be the 7th bit in the CA bit field). An example of an address indicated over multiple cycles using an 8-pin bus is shown in Table 1:

TABLE 1

Example Address Bit Usage

| Cycle | DQ7 | DQ6 | DQ5 | DQ4 | DQ3 | DQ2 | DQ1 | DQ0 |
|---|---|---|---|---|---|---|---|---|
| First | CA7 | CA6 | CA5 | CA4 | CA3 | CA2 | CA1 | CA0 |
| Second | LOW | CA14 | CA13 | CA12 | CA11 | CA10 | CA9 | CA8 |
| Third | PA7 | PA6 | PA5 | PA4 | PA3 | PA2 | PA1 | PA0 |
| Fourth | BA15 | BA14 | PS13 | PS12 | PA11 | PA10 | PA9 | PA8 |
| Fifth | BA23 | BA22 | BA21 | BA20 | BA19 | BA18 | BA17 | BA16 |
| Sixth | LOW | LOW | LOW | LOW | LOW | LA2 | LA1 | LA0 |

If the access command 275 is an SLC access command, there may be bits reserved for indicating the address in multiple-level cell access commands (e.g., according to the address cycles illustrated in Table 1) that are not used in the address cycles for the SLC access command. For example, the bits indicated in Table 1 as PA bits PA11 and PA10 may be used to indicate the 10th and 11th bits in the PA bit field for a multiple-level cell access command, but may be used to indicate a setting (e.g., an SLC setting 280) in an SLC access command. Such bits may be reused because the quantity of possible page addresses supported for an SLC access command may be indicated using ten bits, as opposed to twelve bits for multiple-level cell access commands. The PA11 and PA10 bits may be set to a default value (e.g., 00) in the access command 275 received from the host system 205 if the access command 275 indicates an SLC. The memory system controller 215 (e.g., the FTL) may modify one or more bits of the access command 275 (e.g., the two bits corresponding to PA11 and PA10) to include an indication of a setting (e.g., the SLC setting 280) to be used as part of the access command 275. For example, the memory system controller 215 may indicate a setting from the set of settings (described in reference to FIG. 1) as shown by Table

TABLE 2

Example Setting Encoding Table

| PA11 | PA10 | Setting |
|---|---|---|
| 0 | 0 | Static setting |
| 0 | 1 | Dynamic setting |
| 1 | 0 | High endurance setting |
| 1 | 1 | PSA setting |

Thus, the memory system 210 may modify the access command 275 to indicate that, for example, a static setting is to be used for performing the access operation indicated by the access command 275 by setting both the PA11 bit and the PA10 bit to 0. Additionally or alternatively, other mappings may be used as compared to the example mapping shown in Table 2 for mapping any quantity of bits of an access command 275 to any set of SLC settings 280.

The format for access commands 275 may be configured at the memory system 210, the memory device 240, or both. An access command 275 may include one or more bits indicating an action to be performed (e.g., a read operation, a write operation, an erase operation). The access command 275 may also include one or more bits indicating an address of a memory cell or block of memory cells which may be accessed in response to the access command (e.g., as described herein with reference to Table 1). For example, the access command 275 may include one or more bits indicating a CA, a BA, a PA, an LA, or any combination of these or other address information. In some cases, the access command 275 may include one or more bits (e.g., one or more bits corresponding to a bit index of one or more of the address bits) which indicate a setting (e.g., one of the set of SLC settings 280). For example, the access command 275 may include one or more bits that may be interpreted differently by a memory device 240 (e.g., as indicating either an SLC setting 280 or a portion of an address) depending on whether the access command 275 is an SLC access command or a multiple-level cell access command.

Figure 3:
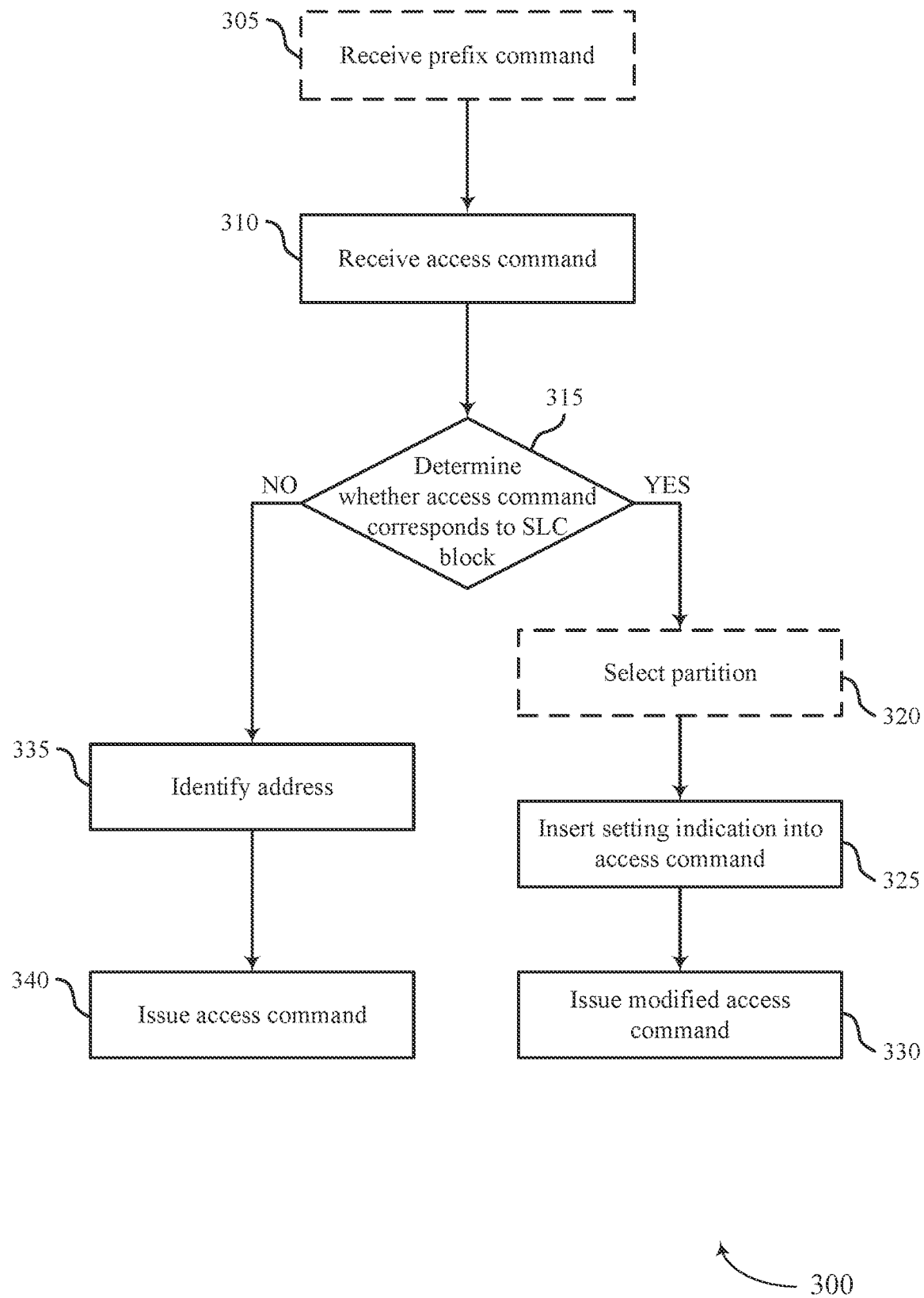
FIGS. 3 and 4 illustrate examples of process flows that support setting switching for SLCs in accordance with examples as disclosed herein.

FIG. 3 illustrates an example of a process flow 300 that supports setting switching for SLCs in accordance with examples as disclosed herein. The process flow 300 may be performed by a memory system, which may be an example of a memory system described with reference to FIGS. 1 and 2. The memory system may be in communication with a host system and a memory device, which may be examples of the respective devices described with reference to FIGS. 1 and 2. In some cases, the operations of the process flow 300 may be performed in a different order than the order shown. Additionally or alternatively, specific operations may be left out of the process flow 300, other operations may be added to the process flow 300, or both.

At 305, a prefix command may be received. For example, the memory system may receive, from the host system, the prefix command. In some cases, the prefix command may indicate an SLC mode. That is, the prefix command may indicate whether a subsequent access command (e.g., the next-received access command) corresponds to an SLC block.

At 310, an access command may be received. For example, the memory system may receive the access command from the host system. The access command may be an example of a read command, a write command, or an erase command and may include an indication of a block of memory cells. For example, the access command sent from the host system may include a virtual address of the block of memory cells on which to perform the corresponding access operation. The access command may include a first one or more bits indicating a CA, a second one or more bits indicating a PA, a third one or more bits indicating a PS, a fourth one or more bits indicating a BA, a fifth one or more bits indicating an LA, or any combination thereof.

At 315, it may be determined whether the access command corresponds to an SLC block. For example, the memory system may determine whether the block of memory cells indicated in the access command (e.g., in the virtual address of the access command) is an SLC block or a multiple-level cell block, such as an MLC block, a TLC block, or a QLC block. In some cases, the determining may be performed using the prefix command received at 305. For example, the prefix command may indicate whether the access command corresponds to an SLC block.

If the access command is determined to correspond to an SLC block at 315, a partition may be selected at 320. The memory system may, using an FTL, select a partition of a set of cells of the SLC block using usage data from the host system, such as a partition selected during a pre-boot sequence. For example, the usage data from the host system may indicate whether the memory system is to perform an access operation in a partition supporting relatively low-latency operations, relatively high reliability operations, relatively high endurance, or some combination thereof. In some cases, the memory system may determine the setting for the SLC block using the selected partition. For example, the memory system may be configured such that the memory system may determine, for a virtual block, the corresponding partition to which the virtual block belongs and the corresponding setting which may be used for the virtual block (e.g., in accordance with the corresponding partition).

The setting may define one or more operating parameters for an access operation corresponding to the access command. For example, the one or more operating parameters may include a voltage to apply during the access operation, a duration for applying the voltage for the access operation, a reference voltage for the access operation, a program verify command for the access operation, or any combination thereof, among other examples. The setting may correspond to one of the set of settings described in reference to FIG. 1. For example, the setting may correspond to a dynamic SLC, a static SLC, a high endurance SLC, or a PSA SLC.

At 325, an indication may be inserted into the access command. For example, the memory system may modify the access command to include one or more bits indicating the setting for accessing one or more memory cells of the SLC block. In some cases, the access command may be modified by setting the bits corresponding to unused bits in the address of the access command to encode the setting, for example as described with reference to Table 2. For example, the memory system may mask the PA11 and PA10 address bits with bits corresponding to an encoding of the setting according to an indication from the memory system controller (e.g., the FTL). The modified bits may indicate which setting of a configured set of settings to use for accessing the memory cells of the SLC block.

At 330, the access command may be issued. For example, the memory system may issue the access command received from the host system at 310 and modified—for example, by the memory system controller at 325—to include an indication of the setting to the memory device. The issued access command may include the one or more bits indicating the setting for the SLC block. The memory device may use the setting indicated by the one or more bits to perform the access operation associated with the access command. Accordingly, the memory device may access the SLC block using the proper setting (e.g., a same setting previously used, such that memory cells of the SLC block are programmed or read correctly according to the previous access operation).

In some cases, the access command may not correspond to an SLC block. In such cases (e.g., if the access command is determined to not correspond to an SLC block at 315), an address may be identified at 335. For example, the memory system may determine an address using a set of bits in the access command. The set of bits may include one or more bits indicating address information in the multiple-level cell access command that correspond to a same one or more bit indices as one or more bits indicating a setting in an SLC access command. The one or more bits may indicate at least a portion of a page address for a multiple-level cell block (e.g., an MLC block, a TLC block, a QLC block, etc.). That is, the memory system may determine that the access command corresponds to a multiple-level cell block and that the address indicated in the access command includes additional bits that may not be present if the access command were to correspond to an SLC block (e.g., the page address bits PA11 and PA10 described with reference to FIG. 2, and dynamically reused to indicate the setting in an SLC access command).

At 340, the access command may be issued. For example, the memory system may issue the access command, corresponding to a multiple-level cell block, to the memory device.

Aspects of the process flow 300 may be implemented by a controller, among other components. Additionally or alternatively, aspects of the process flow 300 may be implemented as instructions stored in memory (e.g., firmware stored in a memory coupled with a memory system). For example, the instructions, if executed by a controller (e.g., the memory system controller 115 or the memory system controller 215), may cause the controller to perform the operations of the process flow 300.

Figure 4:
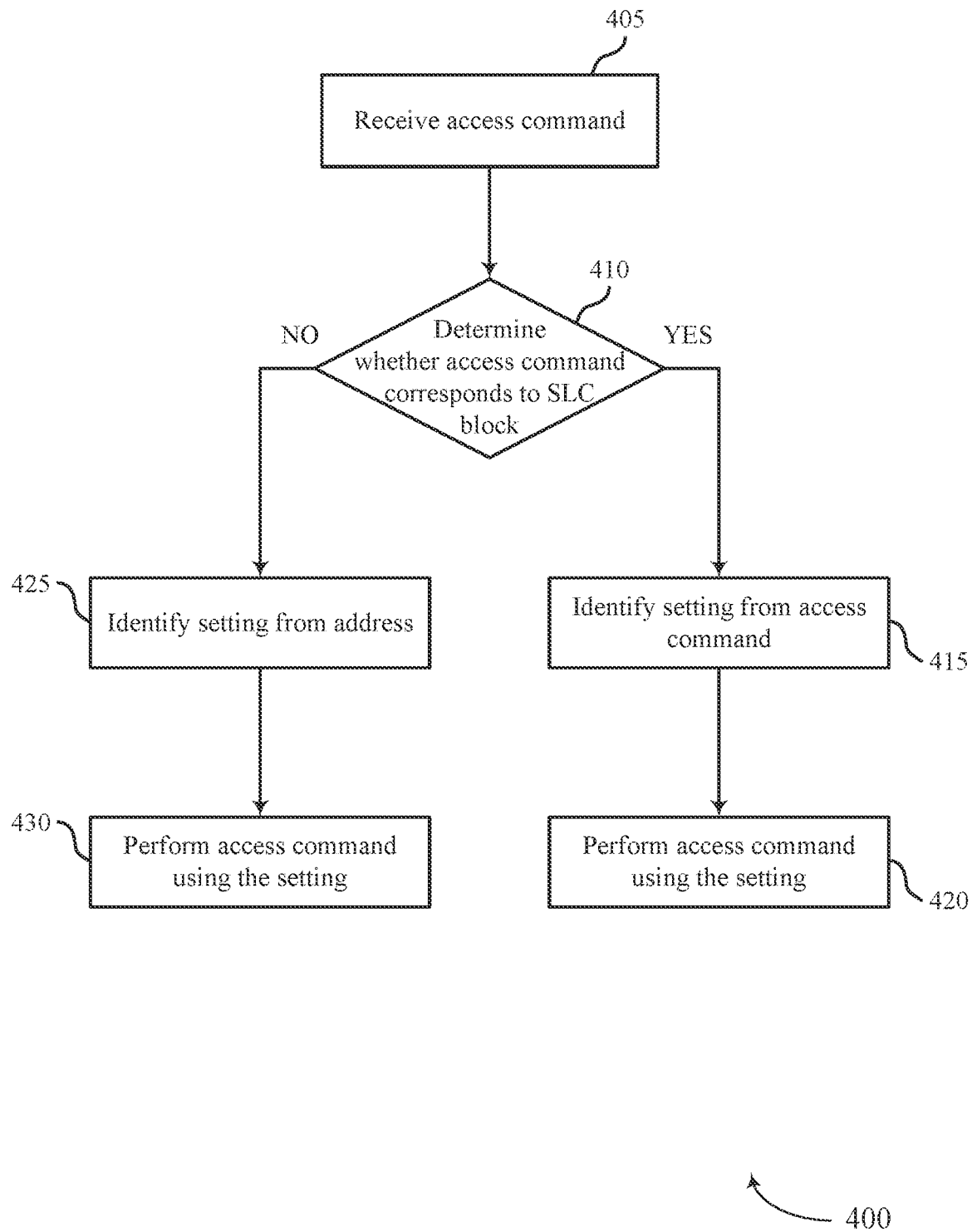

FIG. 4 illustrates an example of a process flow 400 that supports setting switching for SLCs in accordance with examples as disclosed herein. The process flow 400 may be performed by a memory device, which may be an example of a memory device described with reference to FIGS. 1 and 2. The memory device may be in communication with a memory system, which may be an example of the memory system described with reference to FIGS. 1 through 3. In some cases, the operations of the process flow 400 may be performed in a different order than the order shown. Additionally or alternatively, specific operations may be left out of the process flow 400, other operations may be added to the process flow 400, or both.

At 405, an access command may be received. For example, the memory device may receive, from the memory system, the access command. In some cases, the access command may be the access command described with reference to FIG. 3. That is, the access command may be a read command, a write command, or an erase command and may correspond to an access operation for either an SLC block or a multiple-level cell block (an MLC block, a TLC block, a QLC block). The access command may include a first one or more bits indicating a CA, a second one or more bits indicating a PA, a third one or more bits indicating a PS, a fourth one or more bits indicating a BA, a fifth one or more bits indicating an LA, or any combination thereof.

At 410, it may be determined whether the access command received at 405 corresponds to an SLC block. For example, the memory device may determine whether the access command received from the memory system corresponds to an SLC block or to a multiple-level cell block. In some examples, the memory device may determine a type of block accessed by the access command using an address indicated by the access command. In some other examples, the memory device may receive a prefix command indicating whether the access command corresponds to an SLC block. In yet some other examples, the access command may include an indicator indicating whether the access command corresponds to an SLC block or a multiple-level cell block.

If the access command is determined to correspond to an SLC block, at 415, a setting may be identified. For example, the memory device may identify a setting (e.g., one of the set of configured settings as described with reference to FIG. 1) using one or more bits included in the access command. In some cases, the setting may be encoded by the one or more bits, with each state of the one or more bits corresponding to a specific setting, for example, as shown in Table 2. In some examples, the one or more bits may correspond to one or more bit indices for the access command. The one or more bit indices may indicate either the setting for accessing an SLC block if the access command corresponds to an SLC or at least a portion of a PA if the access command corresponds to a multiple-level cell.

At 420, the access operation corresponding to the access command may be performed using the setting identified at 415. For example, the memory device may perform the access operation (e.g., perform a read, write, or erase operation) using the setting identified at 415 for accessing the SLC block. For example, the setting may correspond to a dynamic SLC, a static SLC, a high endurance SLC, or a PSA SLC. The setting may include one or more operational parameters for performing the access operation. In some cases, the one or more operational parameters include a voltage to apply during the access operation, a duration for applying the voltage during the access operation, a reference voltage for the access operation, a program verify command for the access operation, or any combination thereof, among other examples. The memory device may perform the access operation on one or more memory cells of the indicated SLC block using the one or more operational parameters for the indicated setting.

In some cases, the access command may be an example of a read command. In such cases, performing the access operation may include determining a state of the SLC block using the setting for the SLC block and issuing, to the memory system and in response to the access command, an indication of the state of the SLC block. In some other cases, the access command may be an example of a write command or an erase command. In such cases, performing the access operation may include applying a voltage to the SLC block using the setting for the SLC block to change a logical state (e.g., to a "1" or a "0") indicated by a memory cell of the SLC block.

In some cases, the access command may not correspond to an SLC block. In such cases (e.g., if the access command is determined to correspond to a multiple-level cell block at 410), an address may be identified at 425. For example, the memory device may determine that the access command corresponds to a multiple-level cell block, and thus an additional one or more bits included in the access command indicate at least a portion of a page address (e.g., the page address bits PA11 and PA10 as described with reference to FIG. 2). The memory device may use the one or more bits corresponding to the one or more bits indices that indicate the setting in an SLC access command to determine an address for a multiple-level cell access command.

At 430, the access command may be performed. For example, the memory device may perform the access command (e.g., perform a read, write, or erase operation) on one or more multiple-level memory cells indicated by the address (including the one or more bits) included in the access command.

Aspects of the process flow 400 may be implemented by a controller, among other components. Additionally or alternatively, aspects of the process flow 400 may be implemented as instructions stored in memory (e.g., firmware stored in a memory coupled with a memory device). For example, the instructions, if executed by a controller (e.g., a local controller 135), may cause the controller to perform the operations of the process flow 400.

Figure 5:
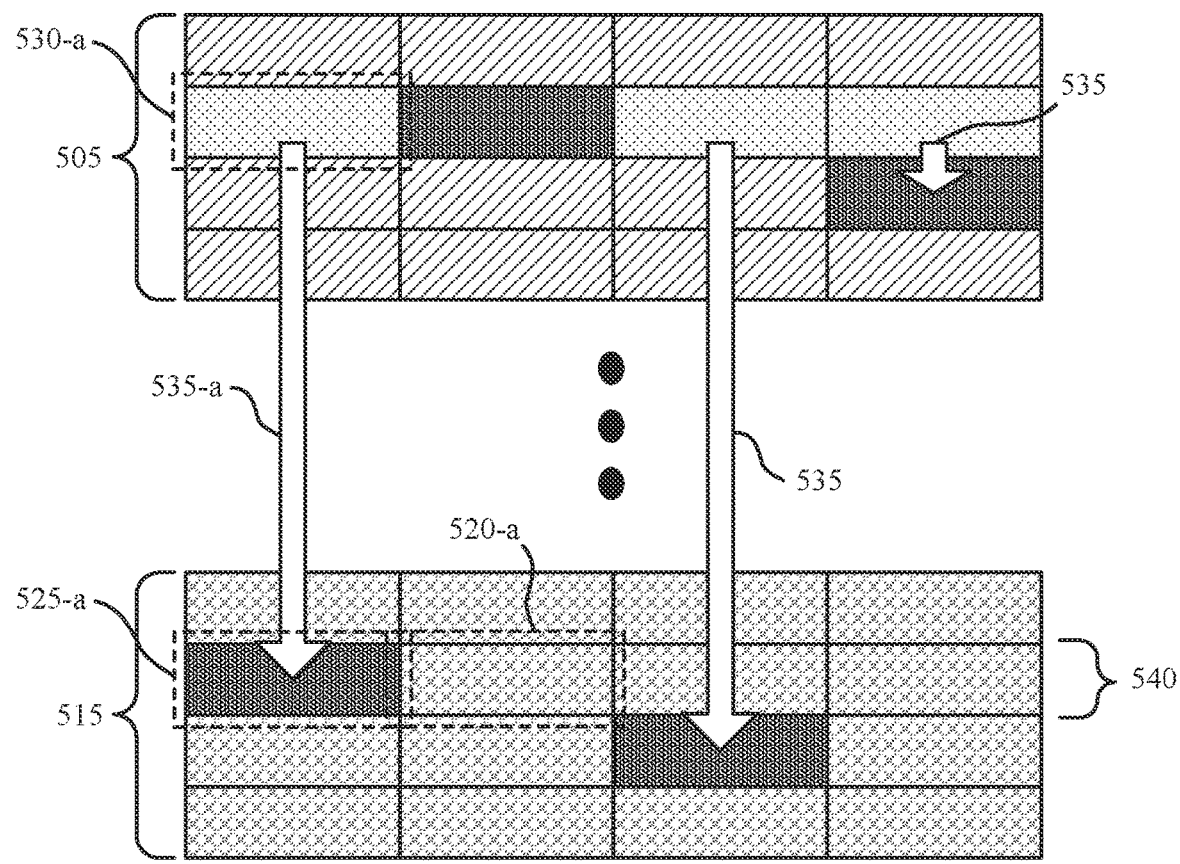
FIG. 5 illustrates an example of a set of memory cells that supports setting switching for SLCs in accordance with examples as disclosed herein.
Figure 5:
Figure 5:
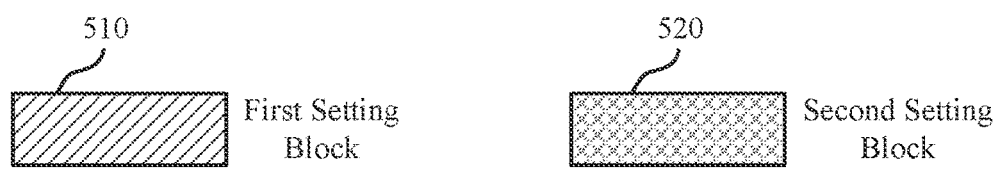

FIG. 5 illustrates an example of a set of memory cells 500 that supports setting switching for SLCs in accordance with examples as disclosed herein. The set of memory cells 500 may include a first partition 505 in which a first setting is used for access operations on the blocks (e.g., first setting blocks 510) and a second partition 515 in which a second setting is used for access operations on the blocks (e.g., second setting blocks 520). The rows of the first partition 505 and second partition 515 may correspond to a block address or a block identifier (ID), while the columns of the first partition 505 and second partition 515 may correspond to a plane address or plane ID. That is, blocks of memory cells within a same row may share a block address but may be in separate planes of the memory device. By way of example, the first setting may be a static setting, while the second setting may be a dynamic setting. That is, the first setting blocks 510 may be blocks of memory which have been programmed using the static setting, and the second setting blocks 520 may be blocks of memory which have been programmed using the dynamic setting (e.g., the static and dynamic settings described with reference to FIG. 1). In some examples, a memory device including the set of memory cells 500 may support a system plus EM1 partition that uses a first setting (e.g., static SLC trims), a normal partition that uses a second setting (e.g., dynamic SLC trims), an EM2 partition that uses a third setting (e.g., high endurance SLC trims), or some combination thereof.

In some case, one or more blocks of the first partition 505, the second partition 515, or both may be examples of a bad block 525. That is, data stored in a bad block 525 may have become corrupted, or the bad block 525 may have become damaged and may no longer be reliable. In such cases, a memory device may transfer data stored in a bad block 525 to a replacement block 530. The memory device may write the data to the replacement block 530 using the same setting used to originally write the data to the bad block 525. For example, the physical address where the data is written may change, but the virtual or logical address may not, as the replacement block 530 may be handled as if it is the replaced bad block 525. In some cases, the bad block 525 may be replaced 535 by a replacement block 530 that is in the same plane (e.g., corresponding to the same column in the set of memory cells 500) as the bad block 525.

In some examples, the memory system may perform a multiplane operation. That is, the memory system may perform an access operation (e.g., a read, write, or erase operation) on blocks spanning different planes (e.g., an access operation performed on blocks corresponding to the same block ID across multiple planes).

In some cases, a memory system may use a block address range scheme to determine the setting used for the multiplane operation. The block address range scheme may determine a setting using a physical address for a block and may use the same setting across multiple planes (e.g., each plane) of the multiplane operation. However, if a bad block (e.g., the bad block 525-*a* in the first plane and the second partition 515) has been replaced 535 by a replacement block 530 (e.g., replaced 535-*a* by the replacement block 530-*a* in the first plane and the first partition 505), the setting of each of the blocks included in the multiplane operation may not correspond to the same setting. In such cases, the memory system may use, for example, the setting corresponding to one of the blocks of the multiplane operation for each of the blocks of the multiplane operation. Thus, a block address scheme may result in performing access operations (e.g., read, write, or erase operations) on blocks of memory cells using a different setting than the setting used to previously write to the block of memory cells. For example, if using a block address scheme, data initially written to the bad block 525-*a* may be moved to the replacement block 530-*a*, and the data in the replacement block 530-*a* may be written using the second setting, despite the block being physically located in the first partition 505. If the memory device performs a multiplane access operation on row 540, the memory device may identify the replacement block 530-*a* and determine to use the first setting due to the replacement block 530-*a* being located in the first partition 505. Accordingly, a multiplane access operation may use the first setting to access the second setting block 520-*a*. However, if the memory device performs a single plane access operation on the second setting block 520-*a*, the memory device may determine to use the second setting due to the second setting block 520-*a* being located in the second partition 515. Accordingly, such a scheme may result in using mismatching settings for a block. In some cases, mismatched settings may cause the memory device to read the block using different voltage thresholds than were used for writing, or to not properly adjust the voltage for a write or erase operation, leading to unexpected voltage distributions.

However, in contrast, a memory system may instead indicate the setting for an access operation in an access command, such that a memory device may avoid using mismatching settings for access operations. For example, as described with reference to FIGS. 1 through 4, the memory system may modify an SLC access command to indicate a setting for performing an access operation. Accordingly, the memory system may indicate the same setting (e.g., the second setting) for a multiplane access operation at row 540, a single plane access operation for the second setting block 520-*a*, and a single plane access operation for the replacement block 530-*a*, such that the memory device access the blocks using the same operating parameters corresponding to the indicated setting. Using one or more bits to indicate the setting in the access command may result in using a same setting for reading from and writing to a block of memory cells, which may improve performance by decreasing the likelihood or read errors, as well as improving read speed and reducing power consumption associated with performing additional operations in the case of a failed access command. Additionally or alternatively, the memory device may support improved flexibility in bad block 525 replacement, as a bad block 525 may be replaced from any pool (e.g., partition) of fresh blocks (e.g., blocks available to use as replacement blocks 530) regardless of the pool in which the bad block 525 is located.

Figure 6:
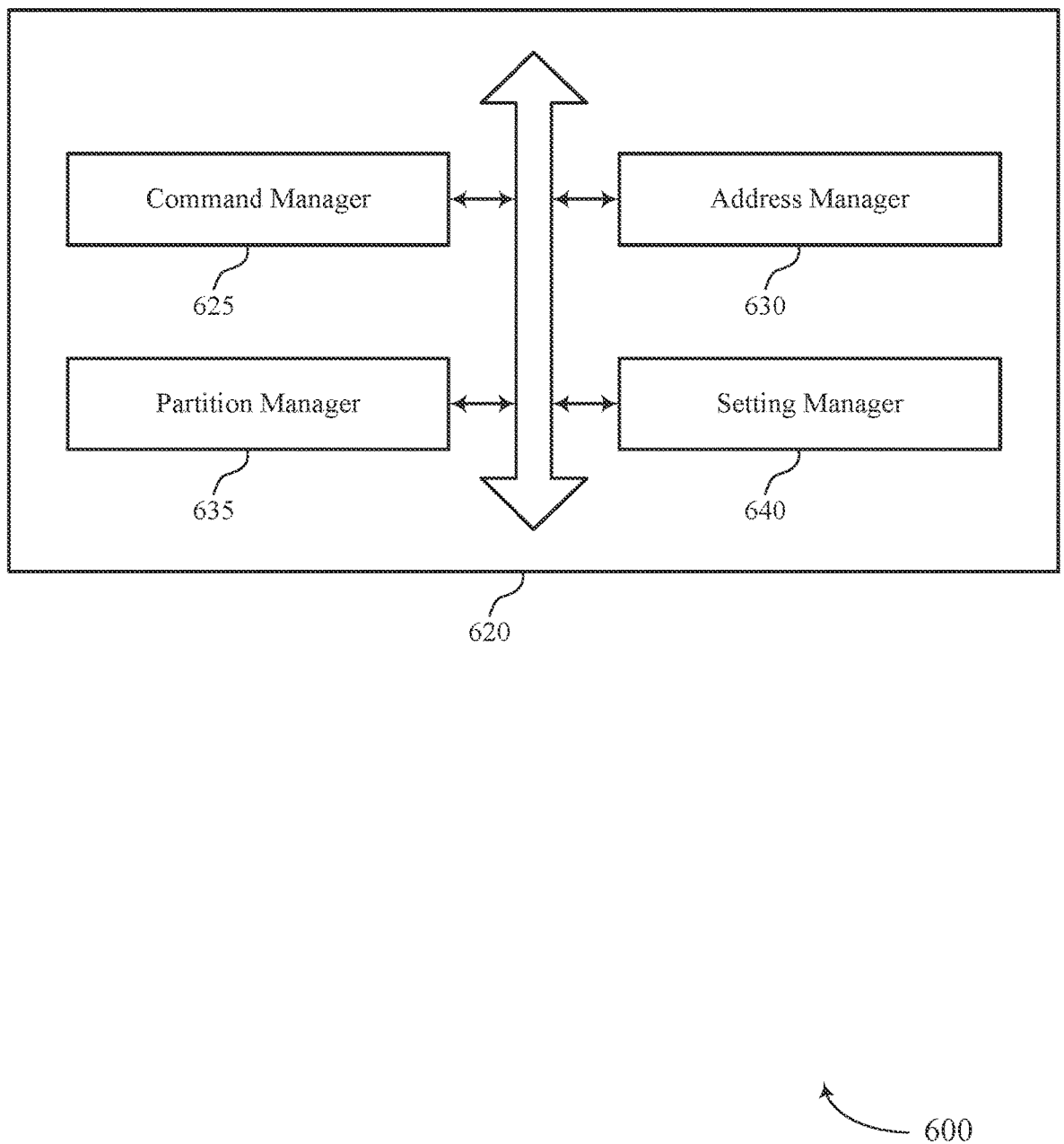
FIG. 6 shows a block diagram of a memory system that supports setting switching for SLCs in accordance with examples as disclosed herein.

FIG. 6 shows a block diagram 600 of a memory system 620 that supports setting switching for SLCs in accordance with examples as disclosed herein. The memory system 620 may be an example of aspects of a memory system as described with reference to FIGS. 1 through 5. The memory system 620, or various components thereof, may be an example of means for performing various aspects of on-the-fly setting switching for SLCs using access commands as described herein. For example, the memory system 620 may include a command manager 625, an address manager 630, a partition manager 635, a setting manager 640, or any combination thereof. Each of these components may communicate, directly or indirectly, with one another (e.g., via one or more buses).

The command manager 625 may be configured as or otherwise support a means for receiving, from a host system, an access command for a memory device. The address manager 630 may be configured as or otherwise support a means for determining whether the access command corresponds to an SLC of the memory device. In some examples, the address manager 630 may be configured as or otherwise support a means for modifying the access command to include one or more bits indicating a setting for accessing one or more memory cells of an SLC block based at least in part on (e.g., in response to) determining that the access command corresponds to the SLC. In some examples, the command manager 625 may be configured as or otherwise support a means for issuing, to the memory device, the access command including the one or more bits indicating the setting for the SLC block based at least in part on (e.g., using the access command generated by) the modifying.

In some examples, the address manager 630 may be configured as or otherwise support a means for determining whether the one or more bits indicate the setting for accessing the SLC block or indicate at least a portion of a page address based at least in part on (e.g., in response to) determining whether the access command corresponds to the SLC.

In some examples, the one or more bits correspond to one or more bit indices for the access command. In some examples, the one or more bit indices are configured to indicate either the setting for accessing the SLC block if the access command corresponds to the SLC or at least the portion of the page address if the access command corresponds to a multiple-level cell.

In some examples, the command manager 625 may be configured as or otherwise support a means for receiving, from the host system, an additional access command for the memory device. In some examples, the address manager 630 may be configured as or otherwise support a means for determining whether the additional access command corresponds to an additional SLC of the memory device. In some examples, the address manager 630 may be configured as or otherwise support a means for determining that the additional access command includes an additional one or more bits corresponding to a same one or more bit indices as the one or more bits, the additional one or more bits indicating at least a portion of a page address for a multiple-level cell block based at least in part on (e.g., in response to) determining that the additional access command fails to correspond to the additional SLC.

In some examples, the partition manager 635 may be configured as or otherwise support a means for selecting a partition of a plurality of SLCs based at least in part on (e.g., using) usage data for the host system. In some examples, the setting manager 640 may be configured as or otherwise support a means for determining the setting for the SLC block based at least in part on (e.g., indicated by) the selected partition, where modifying the access command to include the one or more bits indicating the setting for the SLC block is further based at least in part on (e.g., is performed according to) determining the setting.

In some examples, the command manager 625 may be configured as or otherwise support a means for receiving, from the host system and prior to receiving the access command, a prefix command indicating an SLC mode, where determining that the access command corresponds to the SLC is based at least in part on (e.g., determined using) the prefix command indicating the SLC mode.

In some examples, the setting for accessing the SLC block defines one or more operating parameters for an access operation corresponding to the access command.

In some examples, the one or more operating parameters include a voltage to apply during the access operation, a duration for applying the voltage during the access operation, a reference voltage for the access operation, a program verify command for the access operation, or any combination thereof.

In some examples, the setting for the SLC block includes a dynamic SLC, a static SLC, a high endurance SLC, or a PSA SLC.

In some examples, the access command further includes a first one or more bits indicating a CA, a second one or more bits indicating a PA, a third one or more bits indicating a PS, a fourth one or more bits indicating a BA, a fifth one or more bits indicating an LA, or any combination thereof.

In some examples, the access command includes a read command, a write command, or an erase command.

Figure 7:
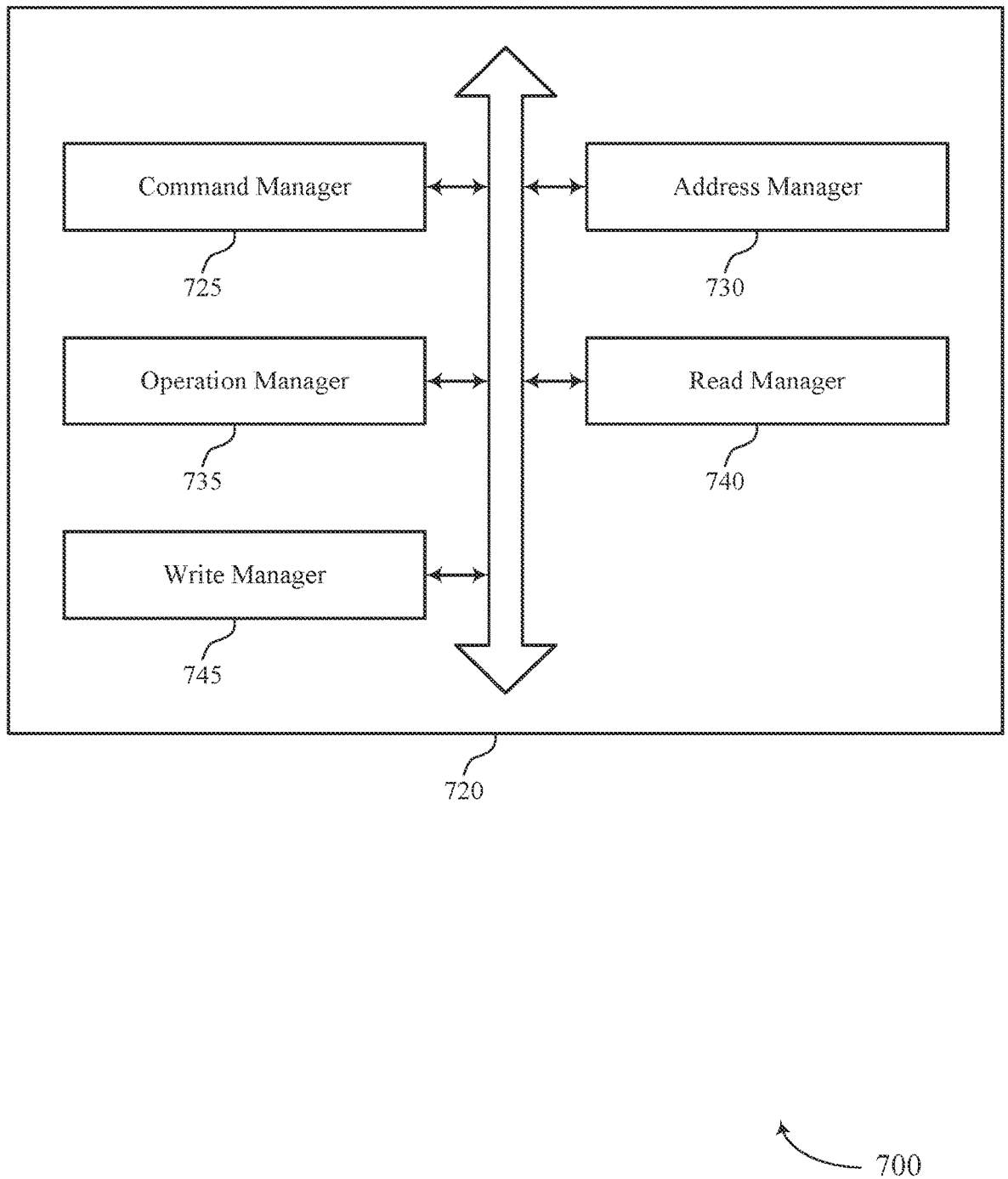
FIG. 7 shows a block diagram of a memory device that supports setting switching for SLCs in accordance with examples as disclosed herein.

FIG. 7 shows a block diagram 700 of a memory device 720 that supports setting switching for SLCs in accordance with examples as disclosed herein. The memory device 720 may be an example of aspects of a memory device as described with reference to FIGS. 1 through 5. The memory device 720, or various components thereof, may be an example of means for performing various aspects of on-the-fly setting switching for SLCs using an access command as described herein. For example, the memory device 720 may include a command manager 725, an address manager 730, an operation manager 735, a read manager 740, a write manager 745, or any combination thereof. Each of these components may communicate, directly or indirectly, with one another (e.g., via one or more buses).

The command manager 725 may be configured as or otherwise support a means for receiving, from a memory system, an access command. The address manager 730 may be configured as or otherwise support a means for determining whether the access command corresponds to an SLC of the memory device. In some examples, the command manager 725 may be configured as or otherwise support a means for performing an access operation corresponding to the access command using a setting for an SLC block indicated by one or more bits of the access command based at least in part on (e.g., in response to) determining that the access command corresponds to the SLC.

In some examples, the address manager 730 may be configured as or otherwise support a means for determining whether the one or more bits of the access command indicate the setting for the SLC block or indicate at least a portion of a PA based at least in part on (e.g., in response to) determining whether the access command corresponds to the SLC.

In some examples, the one or more bits correspond to one or more bit indices for the access command. In some examples, the one or more bit indices are configured to indicate either the setting for the SLC block if the access command corresponds to the SLC or at least the portion of the PA if the access command corresponds to a multiple-level cell.

In some examples, the command manager 725 may be configured as or otherwise support a means for receiving, from the memory system, an additional access command. In some examples, the address manager 730 may be configured as or otherwise support a means for determining whether the additional access command corresponds to an additional SLC of the memory device. In some examples, the command manager 725 may be configured as or otherwise support a means for performing an additional access operation corresponding to the additional access command for a PA indicated by an additional one or more bits of the additional access command based at least in part on (e.g., in response to) determining that the additional access command fails to correspond to the additional SLC, where the additional one or more bits correspond to a same one or more bit indices as the one or more bits.

In some examples, to support performing the access operation, the operation manager 735 may be configured as or otherwise support a means for using, for the access operation, one or more operating parameters defined by the setting for the SLC block.

In some examples, the one or more operating parameters include a voltage to apply during the access operation, a duration for applying the voltage during the access operation, a reference voltage for the access operation, a program verify command for the access operation, or any combination thereof.

In some examples, the access command may be an example of a read command. In some examples, to support performing the access operation, the read manager 740 may be configured as or otherwise support a means for determining a state of the SLC block based at least in part on (e.g., using) the setting for the SLC block. In some examples, to support performing the access operation, the read manager 740 may be configured as or otherwise support a means for issuing, to the memory system and in response to the access command, an indication of the state of the SLC block.

In some examples, the access command may be an example of a write command or an erase command. In some examples, to support performing the access operation, the write manager 745 may be configured as or otherwise support a means for applying a voltage to the SLC block based at least in part on (e.g., using) the setting for the SLC block and the access command.

In some examples, the setting for the SLC block includes a dynamic SLC, a static SLC, a high endurance SLC, or a PSA SLC.

In some examples, the access command further includes a first one or more bits indicating a CA, a second one or more bits indicating a PA, a third one or more bits indicating a PS, a fourth one or more bits indicating a BA, a fifth one or more bits indicating an LA, or any combination thereof.

Figure 8:
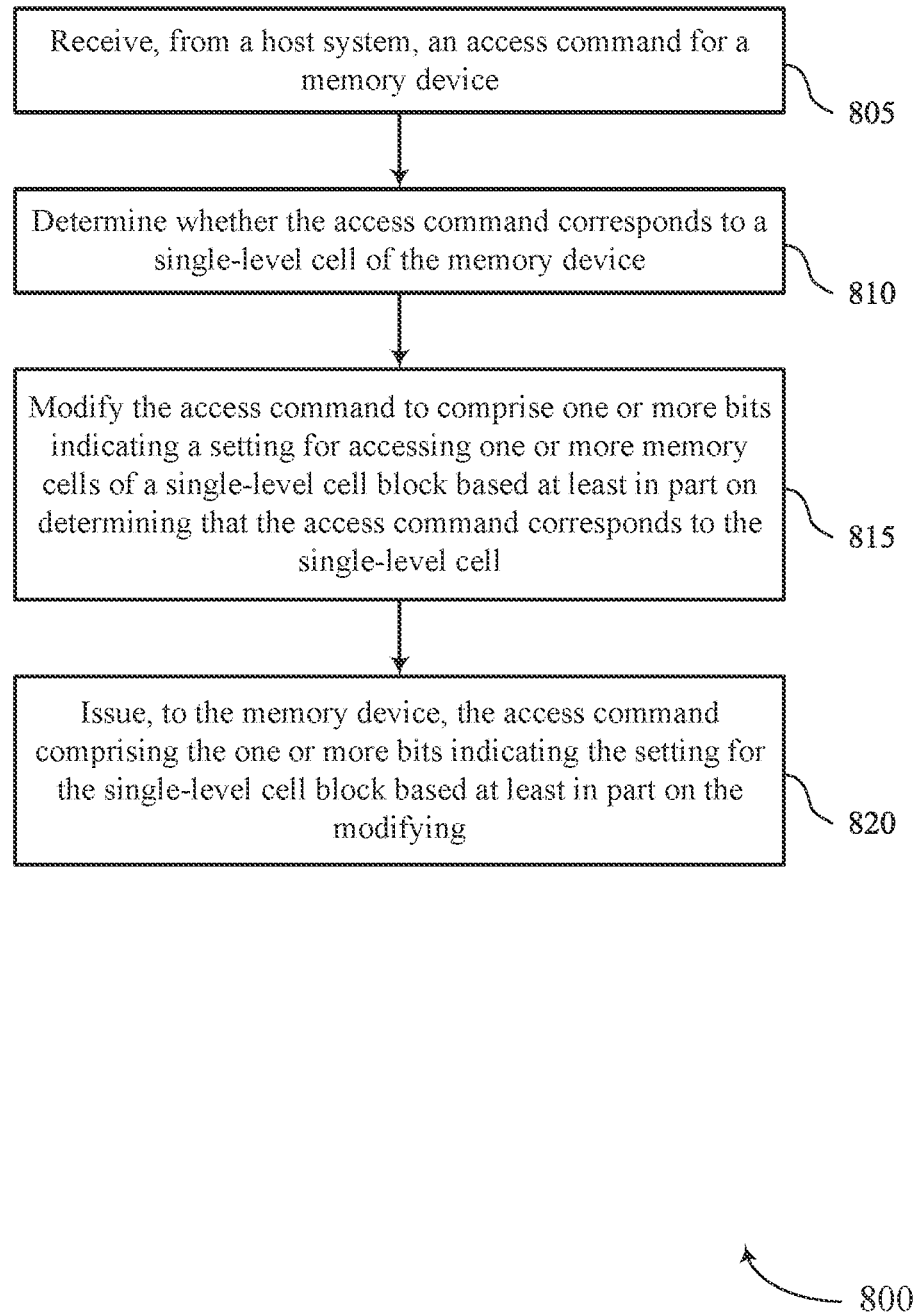
FIGS. 8 and 9 show flowcharts illustrating a method or methods that support setting switching for SLCs in accordance with examples as disclosed herein.

FIG. 8 shows a flowchart illustrating a method 800 that supports setting switching for SLCs in accordance with examples as disclosed herein. The operations of method 800 may be implemented by a memory system or its components as described herein. For example, the operations of method 800 may be performed by a memory system as described with reference to FIGS. 1 through 6. In some examples, a memory system may execute a set of instructions to control the functional elements of the device to perform the described functions. Additionally or alternatively, the memory system may perform aspects of the described functions using special-purpose hardware.

At 805, the method may include receiving, from a host system, an access command for a memory device. The operations of 805 may be performed in accordance with examples as disclosed herein. In some examples, aspects of the operations of 805 may be performed by a command manager 625 as described with reference to FIG. 6.

At 810, the method may include determining whether the access command corresponds to an SLC of the memory device. The operations of 810 may be performed in accordance with examples as disclosed herein. In some examples, aspects of the operations of 810 may be performed by an address manager 630 as described with reference to FIG. 6.

At 815, the method may include modifying the access command to include one or more bits indicating a setting for accessing one or more memory cells of an SLC block based at least in part on (e.g., in response to) determining that the access command corresponds to the SLC. The operations of 815 may be performed in accordance with examples as disclosed herein. In some examples, aspects of the operations of 815 may be performed by an address manager 630 as described with reference to FIG. 6.

At 820, the method may include issuing, to the memory device, the access command including the one or more bits indicating the setting for the SLC block based at least in part on (e.g., using the access command generated by) the modifying. The operations of 820 may be performed in accordance with examples as disclosed herein. In some examples, aspects of the operations of 820 may be performed by a command manager 625 as described with reference to FIG. 6.

Aspects of the method 800 may be implemented by a controller, among other components. Additionally or alternatively, aspects of the method 800 may be implemented as instructions stored in memory (e.g., firmware stored in a memory coupled with a memory system). For example, the instructions, if executed by a controller (e.g., a memory system controller 115 or a memory system controller 215), may cause the controller to perform the operations of the method 800.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving, from a host system, an access command for a memory device, determining whether the access command corresponds to an SLC of the memory device, modifying the access command to include one or more bits indicating a setting for accessing one or more memory cells of an SLC block based at least in part on (e.g., in response to) determining that the access command corresponds to the SLC, and issuing, to the memory device, the access command including the one or more bits indicating the setting for the SLC block based at least in part on (e.g., using the access command generated by) the modifying.

Some examples of the method 800 and the apparatus described herein may further include operations, features, circuitry, logic, means, or instructions for determining whether the one or more bits indicate the setting for accessing the SLC block or indicate at least a portion of a PA based at least in part on (e.g., in response to) determining whether the access command corresponds to the SLC.

In some examples of the method 800 and the apparatus described herein, the one or more bits correspond to one or more bit indices for the access command and the one or more bit indices may be configured to indicate either the setting for accessing the SLC block if the access command corresponds to the SLC or at least the portion of the PA if the access command corresponds to a multiple-level cell.

Some examples of the method 800 and the apparatus described herein may further include operations, features, circuitry, logic, means, or instructions for receiving, from the host system, an additional access command for the memory device, determining whether the additional access command corresponds to an additional SLC of the memory device, and determining that the additional access command includes an additional one or more bits corresponding to a same one or more bit indices as the one or more bits, the additional one or more bits indicating at least a portion of a PA for a multiple-level cell block based at least in part on (e.g., in response to) determining that the additional access command fails to correspond to the additional SLC.

Some examples of the method 800 and the apparatus described herein may further include operations, features, circuitry, logic, means, or instructions for selecting a partition of a plurality of SLCs based at least in part on (e.g., using) usage data for the host system and determining the setting for the SLC block based at least in part on (e.g., according to) the selected partition, where modifying the access command to include the one or more bits indicating the setting for the SLC block may be further based at least in part on (e.g., in response to) determining the setting.

Some examples of the method 800 and the apparatus described herein may further include operations, features, circuitry, logic, means, or instructions for receiving, from the host system and prior to receiving the access command, a prefix command indicating an SLC mode, where determining that the access command corresponds to the SLC may be based at least in part on (e.g., in response to) the prefix command indicating the SLC mode.

In some examples of the method 800 and the apparatus described herein, the setting for accessing the SLC block defines one or more operating parameters for an access operation corresponding to the access command.

In some examples of the method 800 and the apparatus described herein, the one or more operating parameters include a voltage to apply during the access operation, a duration for applying the voltage during the access operation, a reference voltage for the access operation, a program verify command for the access operation, or any combination thereof.

In some examples of the method 800 and the apparatus described herein, the setting for the SLC block includes a dynamic SLC, a static SLC, a high endurance SLC, or a PSA SLC.

In some examples of the method 800 and the apparatus described herein, the access command further includes a first one or more bits indicating a CA, a second one or more bits indicating a PA, a third one or more bits indicating a PS, a fourth one or more bits indicating a BA, a fifth one or more bits indicating an LA, or any combination thereof.

In some examples of the method 800 and the apparatus described herein, the access command includes a read command, a write command, or an erase command.

Figure 9:
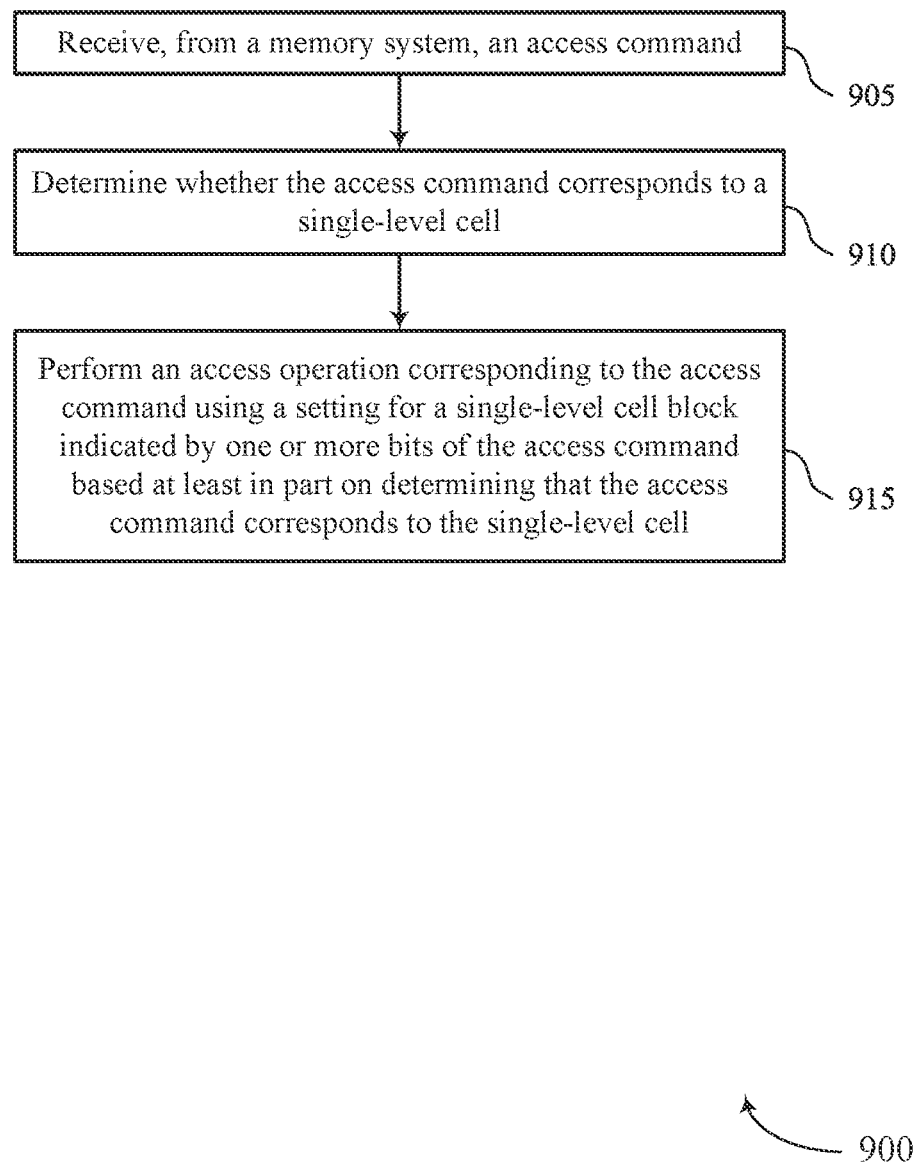

FIG. 9 shows a flowchart illustrating a method 900 that supports setting switching for SLCs in accordance with examples as disclosed herein. The operations of method 900 may be implemented by a memory device or its components as described herein. For example, the operations of method 900 may be performed by a memory device as described with reference to FIGS. 1 through 5 and 7. In some examples, a memory device may execute a set of instructions to control the functional elements of the device to perform the described functions. Additionally or alternatively, the memory device may perform aspects of the described functions using special-purpose hardware.

At 905, the method may include receiving, from a memory system, an access command. The operations of 905 may be performed in accordance with examples as disclosed herein. In some examples, aspects of the operations of 905 may be performed by a command manager 725 as described with reference to FIG. 7.

At 910, the method may include determining whether the access command corresponds to an SLC of the memory device. The operations of 910 may be performed in accordance with examples as disclosed herein. In some examples, aspects of the operations of 910 may be performed by an address manager 730 as described with reference to FIG. 7.

At 915, the method may include performing an access operation corresponding to the access command using a setting for an SLC block indicated by one or more bits of the access command based at least in part on (e.g., in response to) determining that the access command corresponds to the SLC. The operations of 915 may be performed in accordance with examples as disclosed herein. In some examples, aspects of the operations of 915 may be performed by a command manager 725 as described with reference to FIG. 7.

Aspects of the method 900 may be implemented by a controller, among other components. Additionally or alternatively, aspects of the method 900 may be implemented as instructions stored in memory (e.g., firmware stored in a memory coupled with a memory device). For example, the instructions, if executed by a controller (e.g., a local controller 135), may cause the controller to perform the operations of the method 900.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving, from a memory system, an access command, determining whether the access command corresponds to an SLC of the memory device, and performing an access operation corresponding to the access command using a setting for an SLC block indicated by one or more bits of the access command based at least in part on (e.g., in response to) determining that the access command corresponds to the SLC.

Some examples of the method 900 and the apparatus described herein may further include operations, features, circuitry, logic, means, or instructions for determining whether the one or more bits of the access command indicate the setting for the SLC block or indicate at least a portion of a PA based at least in part on (e.g., in response to) determining whether the access command corresponds to the SLC.

In some examples of the method 900 and the apparatus described herein, the one or more bits correspond to one or more bit indices for the access command and the one or more bit indices may be configured to indicate either the setting for the SLC block if the access command corresponds to the SLC or at least the portion of the PA if the access command corresponds to a multiple-level cell.

Some examples of the method 900 and the apparatus described herein may further include operations, features, circuitry, logic, means, or instructions for receiving, from the memory system, an additional access command, determining whether the additional access command corresponds to an additional SLC of the memory device, and performing an additional access operation corresponding to the additional access command for a PA indicated by an additional one or more bits of the additional access command based at least in part on (e.g., in response to) determining that the additional access command fails to correspond to the additional SLC, where the additional one or more bits correspond to a same one or more bit indices as the one or more bits.

In some examples of the method 900 and the apparatus described herein, performing the access operation may include operations, features, circuitry, logic, means, or instructions for using, for the access operation, one or more operating parameters defined by the setting for the SLC block.

In some examples of the method 900 and the apparatus described herein, the one or more operating parameters include a voltage to apply during the access operation, a duration for applying the voltage during the access operation, a reference voltage for the access operation, a program verify command for the access operation, or any combination thereof.

In some examples of the method 900 and the apparatus described herein, the access command may be an example of a read command and the performing the access operation may include operations, features, circuitry, logic, means, or instructions for determining a state of the SLC block based at least in part on (e.g., using) the setting for the SLC block and issuing, to the memory system and in response to the access command, an indication of the state of the SLC block.

In some examples of the method 900 and the apparatus described herein, the access command may be an example of a write command or an erase command and the performing the access operation may include operations, features, circuitry, logic, means, or instructions for applying a voltage to the SLC block based at least in part on (e.g., using) the setting for the SLC block and the access command.

In some examples of the method 900 and the apparatus described herein, the setting for the SLC block includes a dynamic SLC, a static SLC, a high endurance SLC, or a PSA SLC.

In some examples of the method 900 and the apparatus described herein, the access command further includes a first one or more bits indicating a CA, a second one or more bits indicating a PA, a third one or more bits indicating a PS, a fourth one or more bits indicating a BA, a fifth one or more bits indicating an LA, or any combination thereof.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on (e.g., using) the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or technologies such as infrared, radio, and microwave, then the coaxial cable, fiber optic cable, twisted pair, DSL, or technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
  one or more memory devices; and
  processing circuitry coupled with the one or more memory devices and configured to cause the memory system to:
    receive, from a host system, an access command for the one or more memory devices;
    determine whether the access command corresponds to a single-level cell of the one or more memory devices;
    modify the access command to comprise one or more bits indicating a setting for accessing one or more memory cells of a single-level cell block based at least in part on determining that the access command corresponds to the single-level cell; and
    issue, to the one or more memory devices, the access command comprising the one or more bits indicating the setting for the single-level cell block based at least in part on the modifying.

2. The memory system of claim 1, wherein the processing circuitry is further configured to cause the memory system to:
  determine whether the one or more bits indicate the setting for accessing the single-level cell block or indicate at least a portion of a page address based at least in part on determining whether the access command corresponds to the single-level cell.

3. The memory system of claim 2, wherein:
  the one or more bits correspond to one or more bit indices for the access command; and
  the one or more bit indices are configured to indicate either the setting for accessing the single-level cell block if the access command corresponds to the single-level cell or at least the portion of the page address if the access command corresponds to a multiple-level cell.

4. The memory system of claim 1, wherein the processing circuitry is further configured to cause the memory system to:
  receive, from the host system, an additional access command for the one or more memory devices;
  determine whether the additional access command corresponds to an additional single-level cell of the one or more memory devices; and
  determine that the additional access command comprises an additional one or more bits corresponding to a same one or more bit indices as the one or more bits, the additional one or more bits indicating at least a portion of a page address for a multiple-level cell block based at least in part on determining that the additional access command fails to correspond to the additional single-level cell.

5. The memory system of claim 1, wherein the processing circuitry is further configured to cause the memory system to:
  select a partition of a plurality of single-level cells based at least in part on usage data for the host system; and
  determine the setting for the single-level cell block based at least in part on the selected partition, wherein modifying the access command to comprise the one or more bits indicating the setting for the single-level cell block is further based at least in part on determining the setting.

6. The memory system of claim 1, wherein the processing circuitry is further configured to cause the memory system to:
receive, from the host system and prior to receiving the access command, a prefix command indicating a single-level cell mode, wherein determining that the access command corresponds to the single-level cell is based at least in part on the prefix command indicating the single-level cell mode.

7. The memory system of claim 1, wherein the setting for accessing the single-level cell block defines one or more operating parameters for an access operation corresponding to the access command.

8. The memory system of claim 7, wherein the one or more operating parameters comprise a voltage to apply during the access operation, a duration for applying the voltage during the access operation, a reference voltage for the access operation, a program verify command for the access operation, or any combination thereof.

9. The memory system of claim 1, wherein the setting for the single-level cell block comprises a dynamic single-level cell, a static single-level cell, a high endurance single-level cell, or a production state awareness single-level cell.

10. The memory system of claim 1, wherein the access command further comprises a first one or more bits indicating a column address, a second one or more bits indicating a page address, a third one or more bits indicating a plane setting, a fourth one or more bits indicating a block address, a fifth one or more bits indicating a logical unit address, or any combination thereof.

11. The memory system of claim 1, wherein the access command comprises a read command or a write command or an erase command.

12. A memory device, comprising:
one or more memory arrays; and
processing circuitry coupled with the one or more memory arrays and configured to cause the memory device to:
receive, from a memory system, an access command;
determine whether the access command corresponds to a single-level cell of the one or more memory arrays;
determine whether one or more bits of the access command indicate a setting of a plurality of settings, each setting of the plurality of settings for a single-level cell block or whether the one or more bits of the access command indicate at least a portion of a page address based at least in part on determining that the access command corresponds to the single-level cell; and
perform an access operation corresponding to the access command using the setting based at least in part on determining that the one or more bits of the access command indicate the setting.

13. The memory device of claim 12, wherein:
the one or more bits correspond to one or more bit indices for the access command; and
the one or more bit indices are configured to indicate either the setting for the single-level cell block if the access command corresponds to the single-level cell or at least the portion of the page address if the access command corresponds to a multiple-level cell.

14. The memory device of claim 12, wherein the processing circuitry is further configured to cause the memory device to:
receive, from the memory system, an additional access command;
determine whether the additional access command corresponds to an additional single-level cell of the one or more memory arrays; and
perform an additional access operation corresponding to the additional access command for a page address indicated by an additional one or more bits of the additional access command based at least in part on determining that the additional access command fails to correspond to the additional single-level cell, wherein the additional one or more bits correspond to a same one or more bit indices as the one or more bits.

15. The memory device of claim 12, wherein the processing circuitry configured to cause the memory device to perform the access operation is configured to cause the memory device to:
use, for the access operation, one or more operating parameters defined by the setting for the single-level cell block.

16. The memory device of claim 15, wherein the one or more operating parameters comprise a voltage to apply during the access operation, a duration for applying the voltage during the access operation, a reference voltage for the access operation, a program verify command for the access operation, or any combination thereof.

17. The memory device of claim 12, wherein the access command comprises a read command and the processing circuitry configured to cause the memory device to perform the access operation is configured to cause the memory device to:
determine a state of the single-level cell block based at least in part on the setting for the single-level cell block; and
issue, to the memory system and in response to the access command, an indication of the state of the single-level cell block.

18. The memory device of claim 12, wherein the access command comprises a write command or an erase command and the processing circuitry configured to cause the memory device to perform the access operation is configured to cause the memory device to:
apply a voltage to the single-level cell block based at least in part on the setting for the single-level cell block and the access command.

19. The memory device of claim 12, wherein the setting for the single-level cell block comprises a dynamic single-level cell, a static single-level cell, a high endurance single-level cell, or a production state awareness single-level cell.

20. The memory device of claim 12, wherein the access command further comprises a first one or more bits indicating a column address, a second one or more bits indicating a page address, a third one or more bits indicating a plane setting, a fourth one or more bits indicating a block address, a fifth one or more bits indicating a logical unit address, or any combination thereof.

21. A non-transitory computer-readable medium storing code comprising instructions which, when executed by processing circuitry of an electronic device, cause the electronic device to:
receive, from a host system, an access command for a memory device;
determine whether the access command corresponds to a single-level cell of the memory device;

modify the access command to comprise one or more bits indicating a setting for accessing one or more memory cells of a single-level cell block based at least in part on determining that the access command corresponds to the single-level cell; and issue, to the memory device, the access command comprising the one or more bits indicating the setting for the single-level cell block based at least in part on the modifying.

22. The non-transitory computer-readable medium of claim 21, wherein the instructions, when executed by the processing circuitry of the electronic device, further cause the electronic device to:

determine whether the one or more bits indicate the setting for accessing the single-level cell block or indicate at least a portion of a page address based at least in part on determining whether the access command corresponds to the single-level cell.

23. The non-transitory computer-readable medium of claim 22, wherein:

the one or more bits correspond to one or more bit indices for the access command; and the one or more bit indices are configured to indicate either the setting for accessing the single-level cell block if the access command corresponds to the single-level cell or at least the portion of the page address if the access command corresponds to a multiple-level cell.

24. The non-transitory computer-readable medium of claim 21, wherein the instructions, when executed by the processing circuitry of the electronic device, further cause the electronic device to:

receive, from the host system, an additional access command for the memory device;

determine whether the additional access command corresponds to an additional single-level cell of the memory device; and determine that the additional access command comprises an additional one or more bits corresponding to a same one or more bit indices as the one or more bits, the additional one or more bits indicating at least a portion of a page address for a multiple-level cell block based at least in part on determining that the additional access command fails to correspond to the additional single-level cell.

25. The non-transitory computer-readable medium of claim 21, wherein the instructions, when executed by the processing circuitry of the electronic device, further cause the electronic device to:

select a partition of a plurality of single-level cells based at least in part on usage data for the host system; and determine the setting for the single-level cell block based at least in part on the selected partition, wherein modifying the access command to comprise the one or more bits indicating the setting for the single-level cell block is further based at least in part on determining the setting.

26. The non-transitory computer-readable medium of claim 21, wherein the instructions, when executed by the processing circuitry of the electronic device, further cause the electronic device to:

receive, from the host system and prior to receiving the access command, a prefix command indicating a single-level cell mode, wherein determining that the access command corresponds to the single-level cell is based at least in part on the prefix command indicating the single-level cell mode.

27. The non-transitory computer-readable medium of claim 21, wherein the setting for accessing the single-level cell block defines one or more operating parameters for an access operation corresponding to the access command.

28. The non-transitory computer-readable medium of claim 27, wherein the one or more operating parameters comprise a voltage to apply during the access operation, a duration for applying the voltage during the access operation, a reference voltage for the access operation, a program verify command for the access operation, or any combination thereof.

29. The non-transitory computer-readable medium of claim 21, wherein the setting for the single-level cell block comprises a dynamic single-level cell, a static single-level cell, a high endurance single-level cell, or a production state awareness single-level cell.

30. A non-transitory computer-readable medium storing code comprising instructions which, when executed by a processing circuitry of an electronic device, cause the electronic device to:

receive, from a memory system, an access command;

determine whether the access command corresponds to a single-level cell of a memory device;

determine whether one or more bits of the access command indicate a setting of a plurality of settings, each setting of the plurality of settings for a single-level cell block or whether the one or more bits of the access command indicate at least a portion of a page address based at least in part on determining that the access command corresponds to the single-level cell; and perform an access operation corresponding to the access command using the setting based at least in part on determining that the one or more bits of the access command indicate the setting.

31. The non-transitory computer-readable medium of claim 30, wherein:

the one or more bits correspond to one or more bit indices for the access command; and the one or more bit indices are configured to indicate either the setting for the single-level cell block if the access command corresponds to the single-level cell or at least the portion of the page address if the access command corresponds to a multiple-level cell.

32. The non-transitory computer-readable medium of claim 30, wherein the instructions, when executed by the processing circuitry of the electronic device, further cause the electronic device to:

receive, from the memory system, an additional access command;

determine whether the additional access command corresponds to an additional single-level cell of the memory device; and perform an additional access operation corresponding to the additional access command for a page address indicated by an additional one or more bits of the additional access command based at least in part on determining that the additional access command fails to correspond to the additional single-level cell, wherein the additional one or more bits correspond to a same one or more bit indices as the one or more bits.

33. A method performed by a memory system, comprising:

receiving, from a host system, an access command for a memory device;

determining whether the access command corresponds to a single-level cell of the memory device;

modifying the access command to comprise one or more bits indicating a setting for accessing one or more memory cells of a single-level cell block based at least in part on determining that the access command corresponds to the single-level cell; and issuing, to the memory device, the access command comprising the one or more bits indicating the setting for the single-level cell block based at least in part on the modifying.

* * * * *